US009484946B2

(12) United States Patent
Deloge et al.

(10) Patent No.: US 9,484,946 B2
(45) Date of Patent: Nov. 1, 2016

(54) DIGITAL-TO-ANALOG CONVERTER (DAC), METHOD FOR OPERATING A DAC AND TRANSCEIVER CIRCUIT

(71) Applicant: NXP B.V., Eindhoven (NL)

(72) Inventors: Mattieu Deloge, Eindhoven (NL); Arnoud Pieter van der Wel, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/468,078

(22) Filed: Aug. 25, 2014

(65) Prior Publication Data

US 2016/0056832 A1 Feb. 25, 2016

(51) Int. Cl.
*H04B 1/38* (2015.01)
*H03M 1/66* (2006.01)
*H03M 1/08* (2006.01)
*H03M 1/74* (2006.01)

(52) U.S. Cl.
CPC ........... *H03M 1/661* (2013.01); *H03M 1/0881* (2013.01); *H04B 1/38* (2013.01); *H03M 1/745* (2013.01)

(58) Field of Classification Search
CPC ...... H03M 1/66; H03M 3/502; H03M 3/508; H03M 1/001; H03M 1/661; H03M 1/76; H03M 1/765; H03M 3/436; H03M 1/745; G06F 17/17; H04B 1/38; G09G 2310/027; G09G 3/3696; G05B 2219/42207; G06T 3/4007
USPC ........ 375/256, 259, 242, 244, 219; 341/126, 341/135, 144, 145; 327/50, 58
See application file for complete search history.

(56) References Cited

U.S. PATENT DOCUMENTS

| | | | | |
|---|---|---|---|---|
| 5,226,000 A | * | 7/1993 | Moses | G06F 17/17 708/313 |
| 5,260,704 A | * | 11/1993 | Hustig | G06F 17/17 341/144 |
| 5,339,079 A | * | 8/1994 | Ledzius | H03M 1/66 341/144 |
| 5,355,134 A | | 10/1994 | Kasuga et al. | |
| 5,663,728 A | | 9/1997 | Essenwanger | |
| 5,666,160 A | * | 9/1997 | Hwang | G06T 3/4007 348/240.2 |
| 6,462,688 B1 | | 10/2002 | Sutardja | |
| 6,741,197 B1 | * | 5/2004 | Melanson | H03M 3/502 341/143 |

(Continued)

FOREIGN PATENT DOCUMENTS

| | | |
|---|---|---|
| JP | 58182917 A | 10/1983 |
| JP | 58182917 A | 10/1983 |

OTHER PUBLICATIONS

William B. Cleveland, "First Order-Hold Interpolation Digital-to-Analog Converter with Application to Aircraft Simulation,"National Aeronautics and Space Adminstration, Washington, DC, Nov. 1976, pp. 1-22.*

(Continued)

*Primary Examiner* — Tesfaldet Bocure

(57) ABSTRACT

Embodiments of digital-to-analog converters (DACs), methods for operating a DAC, and transceiver circuits are described. In one embodiment, a DAC includes an input terminal configured to receive a digital signal, a converter circuit configured to convert the digital signal into an analog signal using first-order interpolation allowing low electromagnetic emissions, and an output terminal configured to output the analog signal. Other embodiments are also described.

16 Claims, 13 Drawing Sheets

(56) References Cited

U.S. PATENT DOCUMENTS

| | | | |
|---|---|---|---|
| 7,312,739 B1 | 12/2007 | Sutardja et al. | |
| 7,640,281 B2* | 12/2009 | Kirkland | H03M 1/0881 341/126 |
| 2003/0035499 A1* | 2/2003 | Staszewski | H03D 7/125 375/346 |
| 2006/0023821 A1* | 2/2006 | Barnette | H04B 3/23 375/355 |
| 2006/0145902 A1* | 7/2006 | Tucholski | H03M 1/66 341/144 |
| 2009/0009453 A1* | 1/2009 | Furihata | G09G 3/3685 345/87 |
| 2009/0029656 A1 | 1/2009 | Sicard | |
| 2009/0115462 A9 | 5/2009 | Redoute et al. | |
| 2009/0196384 A1* | 8/2009 | Staszewski | H03D 7/125 375/346 |
| 2012/0223847 A1* | 9/2012 | Mazumdar | G06F 1/0356 341/100 |
| 2014/0002433 A1* | 1/2014 | Knausz | H03M 1/661 345/211 |

OTHER PUBLICATIONS

Hardware Requirements for LIN, CAN and FlexRay Interfaces in Automotive Applications, Audi; BMW; Daimler; Porsche & Volkswagen, rev 1.2, 2011, 1-35.

An EMI Resisting LIN Driver in 0.35-micron High-Voltage CMOS, Redoute, J. M. and Steyaert, M IEEE journal of Solid-State Circuits, vol. 42, pp. 1574-1582, 2007.

LIN specification package, LIN consortium, rev 2.2a, 2010, pp. 1-194.

Combine Low Cost, High EMI and ultra-low Emissions in the LIN phy, Lopez D. et al, 2012, http://electronicdesign.com/energy/combine-low-cost-high-emi-immunity-and-ultra-low-emissions-lin-phy, pp. 1-6.

Extended European Search Report for Patent Appln. No. 15181432.4 (Mar. 4, 2016).

\* cited by examiner

US 9,484,946 B2

1

DIGITAL-TO-ANALOG CONVERTER (DAC), METHOD FOR OPERATING A DAC AND TRANSCEIVER CIRCUIT

BACKGROUND

A waveshaping digital-to-analog converter (DAC) can be used in a communications circuit to create an analog signal that is transmitted on a communications bus. Compared to an analog-based waveshaping circuit, a waveshaping DAC can provide easy configurability and allows low-power operation. However, a conventional waveshaping DAC performs digital-to-analog conversation in discrete steps, which may cause the electromagnetic emission (EME) to violate protocol specifications. A low-pass filter can be used to reduce the amplitude of the high frequency harmonics of a waveshaping DAC, which can reduce the EME of a corresponding communications circuit. However, an extra low-pass filter can occupy additional silicon area and consume additional power.

SUMMARY

Embodiments of DACs, methods for operating a DAC, and transceiver circuits are described. In one embodiment, a DAC includes an input terminal configured to receive a digital signal, a converter circuit configured to convert the digital signal into an analog signal using first-order interpolation, and an output terminal configured to output the analog signal. Compared to a conventional waveshaping DAC that performs digital-to-analog conversation in discrete steps, performing digital-to-analog conversation using first-order interpolation reduces the EME of the DAC and eliminates the need for an extra low-pass filter. Other embodiments are also described.

In an embodiment, a method for operating a DAC involves receiving a digital signal, converting the digital signal into an analog signal using first-order interpolation, and outputting the analog signal.

In an embodiment, a transceiver circuit includes a receiver section and a transmitter section for connection to a single-ended communications bus. The transmitter section includes a DAC, which includes an input terminal configured to receive a digital signal, a converter circuit configured to convert the digital signal into an analog signal using first-order interpolation, and an output terminal configured to output the analog signal.

Other aspects and advantages of embodiments of the present invention will become apparent from the following detailed description, taken in conjunction with the accompanying drawings, depicted by way of example of the principles of the invention.

2

Figure 1:
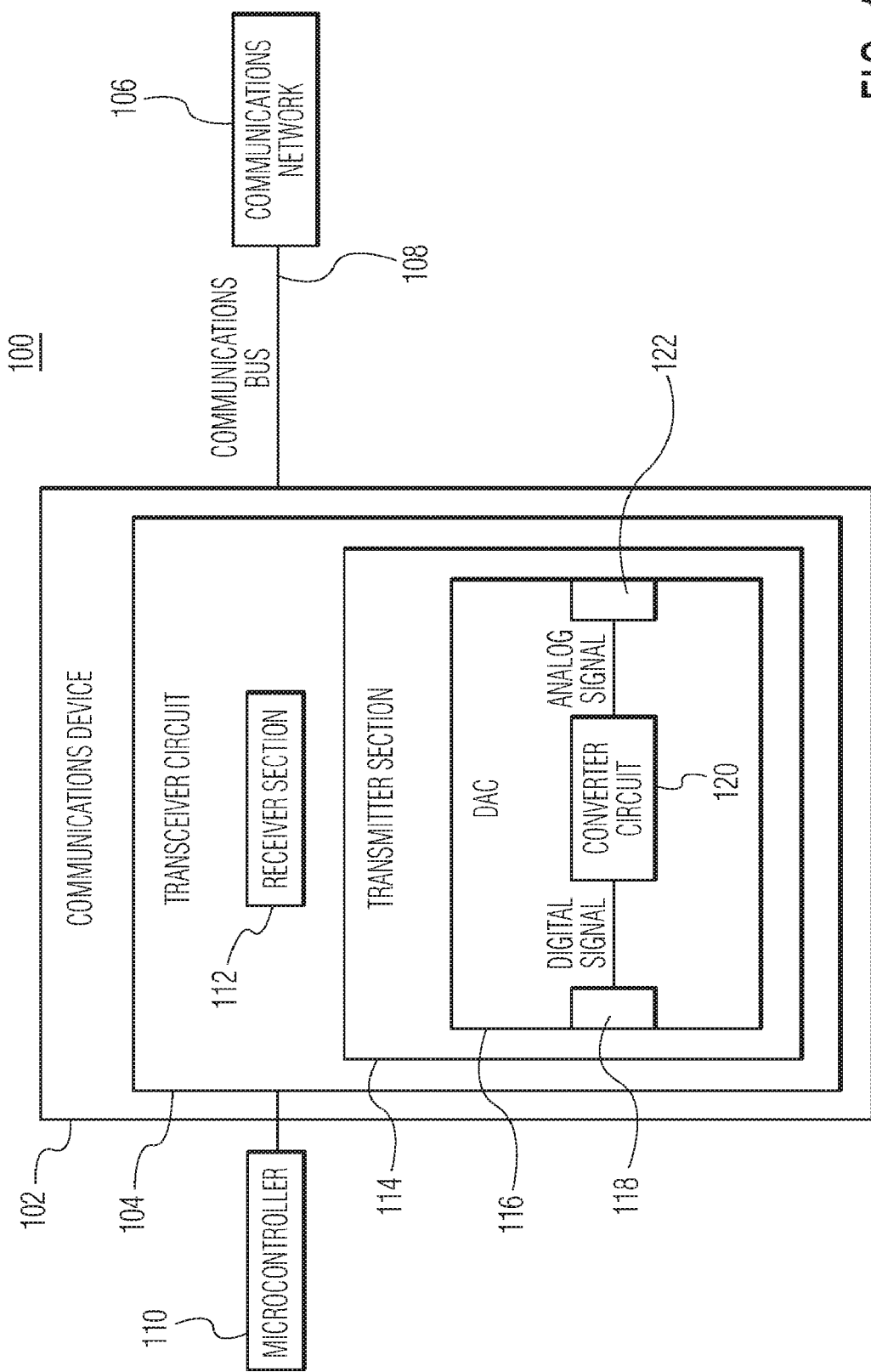
FIG. 1 is a schematic block diagram of a communications system in accordance with an embodiment of the invention.
Figure 7:
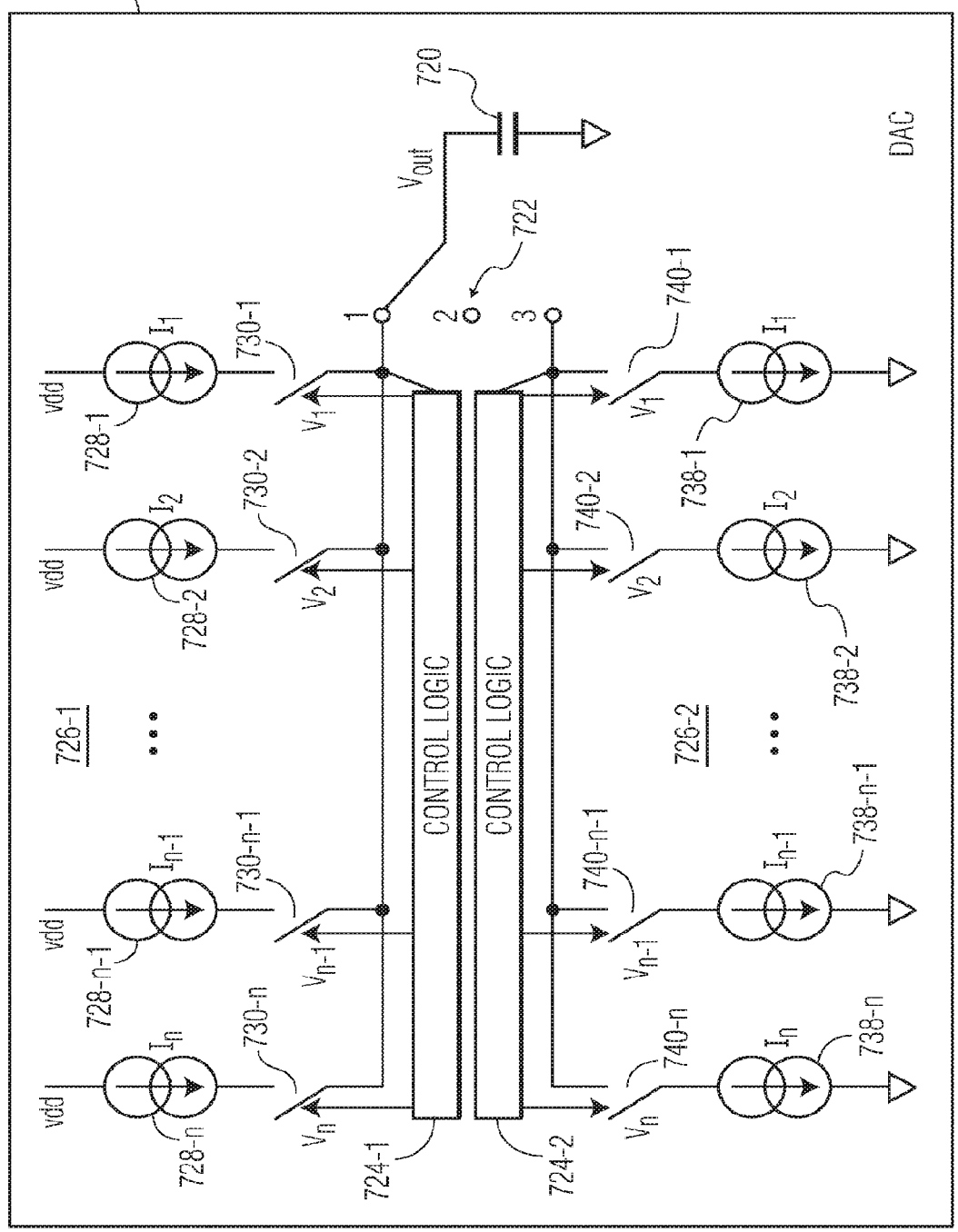

FIG. 7 depicts an embodiment of the DAC of FIG. 1 that is formed by a capacitor charged or discharged by constant current sources.

Figure 8:
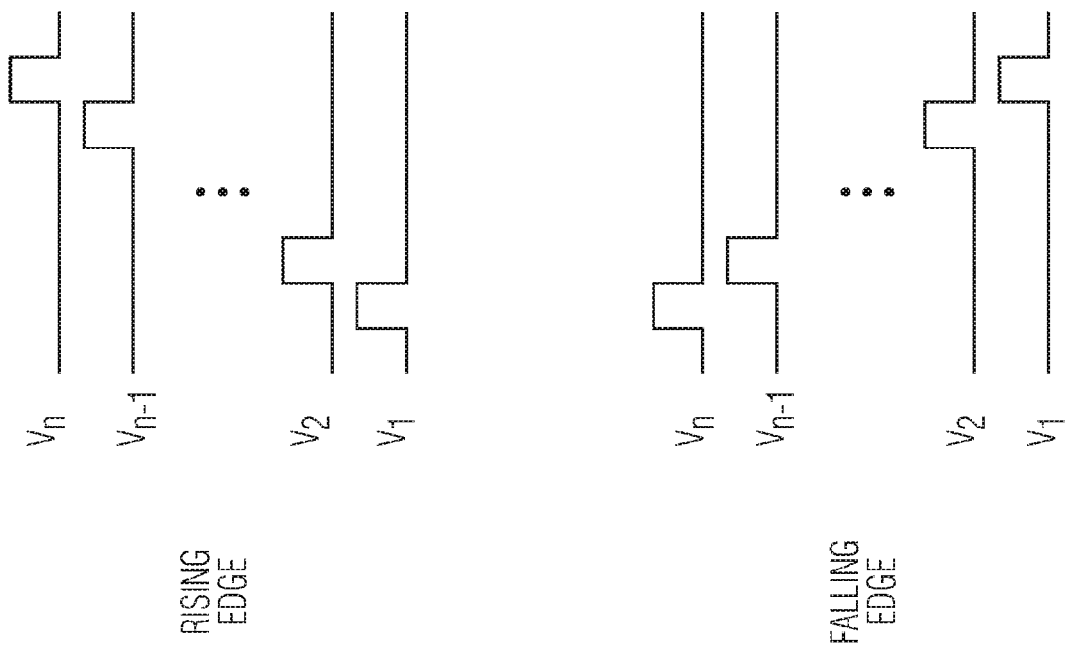

FIG. 8 is a graph of voltage signals that are generated by shift registers of the DAC depicted in FIG. 7.

Figure 9:
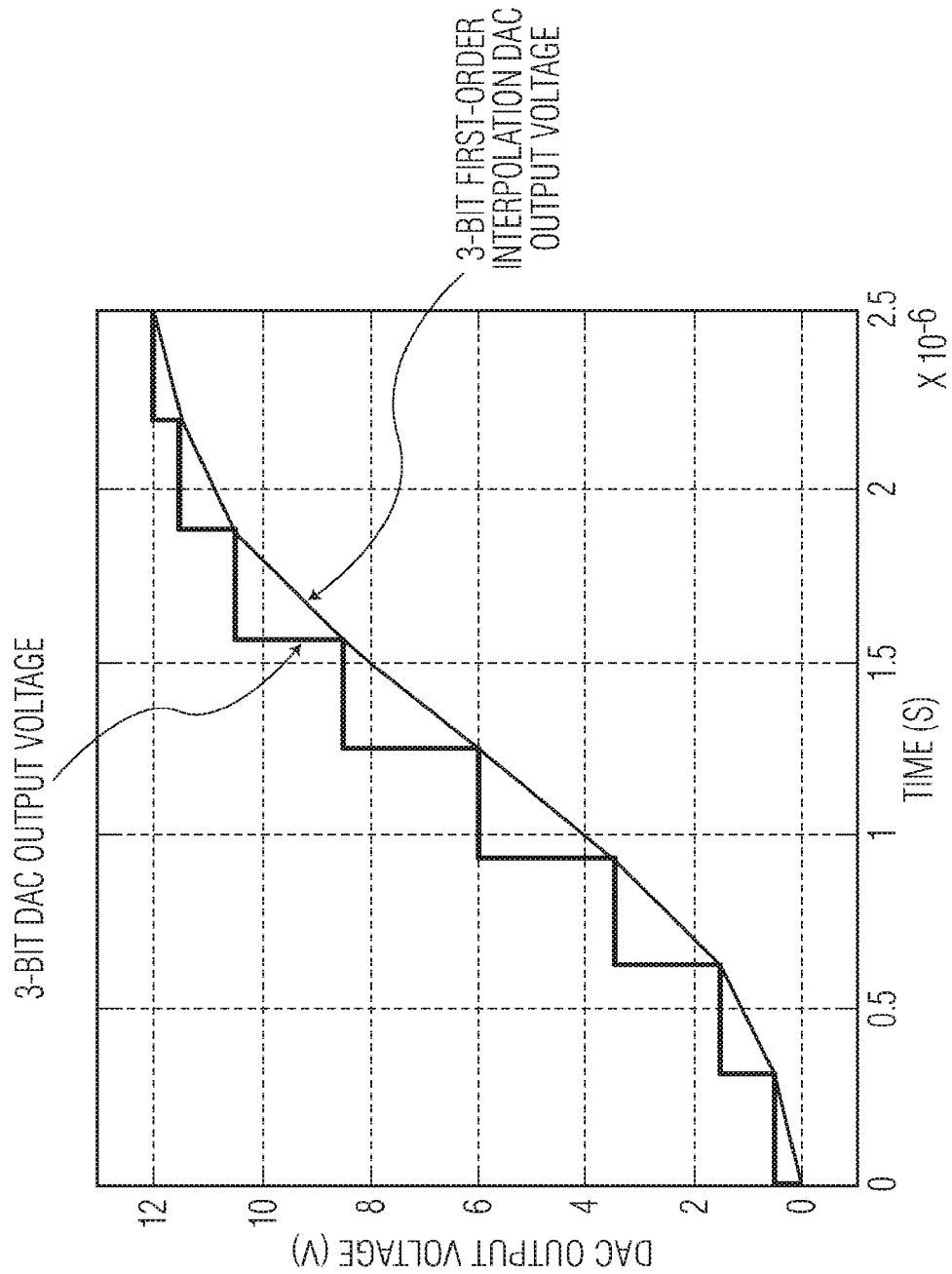

FIG. 9 is a graph of a rising edge of the output voltage of the DAC depicted in FIG. 7 versus a rising edge of the output voltage of a conventional 3-bit DAC.

Figure 10:
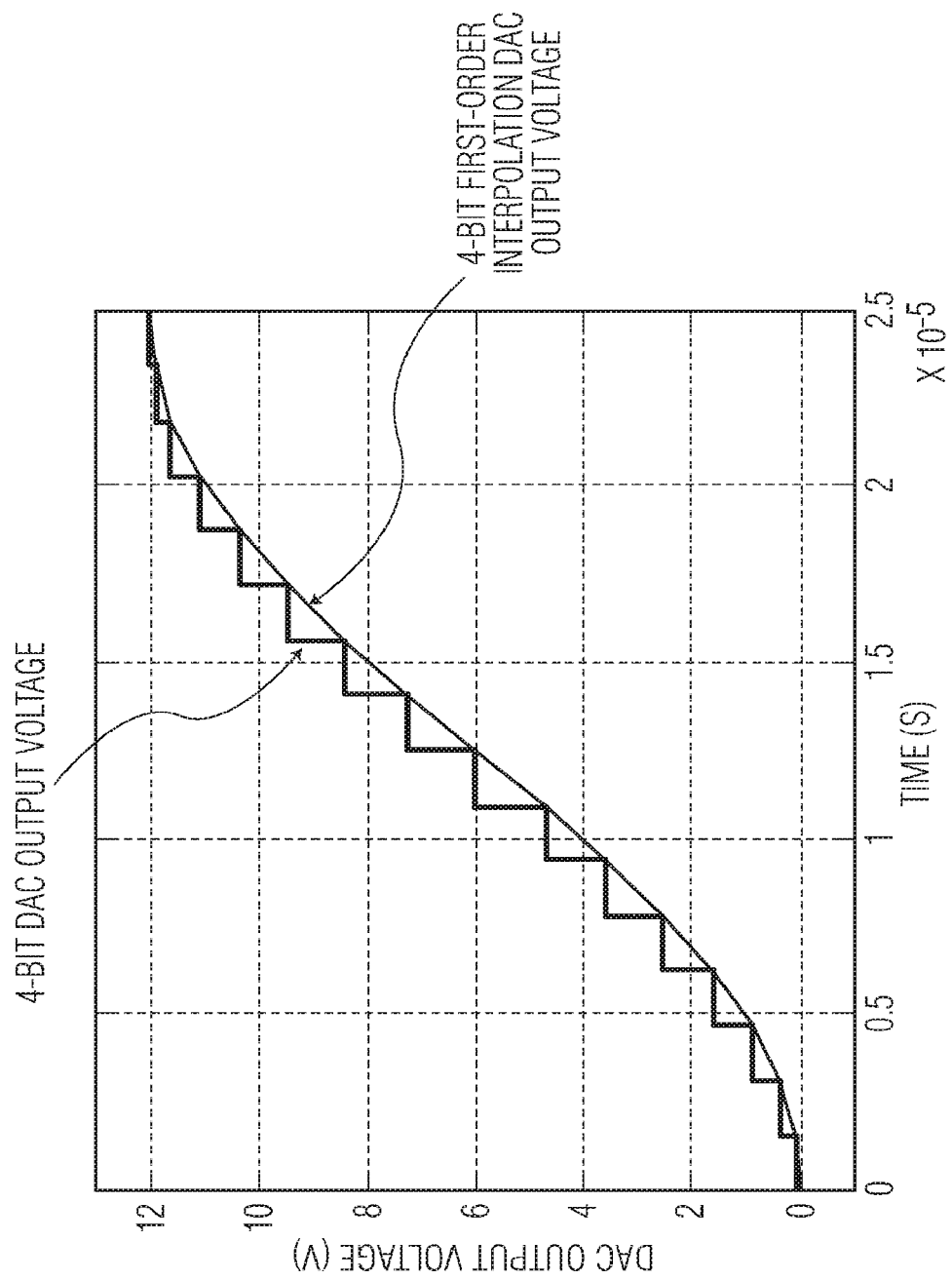

FIG. 10 is a graph of a rising edge of the output voltage of the DAC depicted in FIG. 7 versus a rising edge of the output voltage of a conventional 4-bit DAC.

Figure 11:
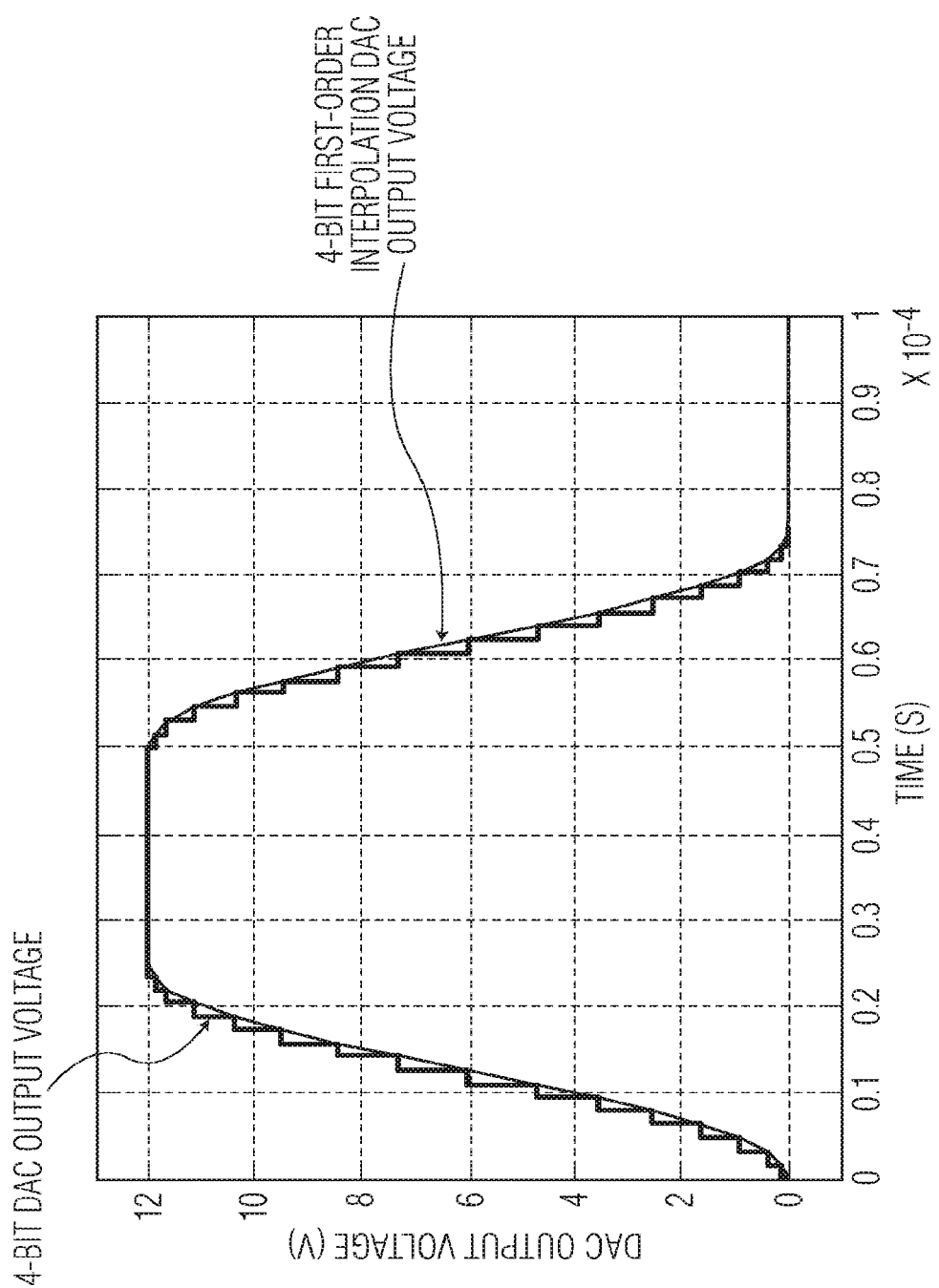

FIG. 11 is a graph of a complete waveform of the output voltage of the DAC depicted in FIG. 7 versus a complete waveform of the output voltage of a conventional 4-bit DAC.

Figure 12:
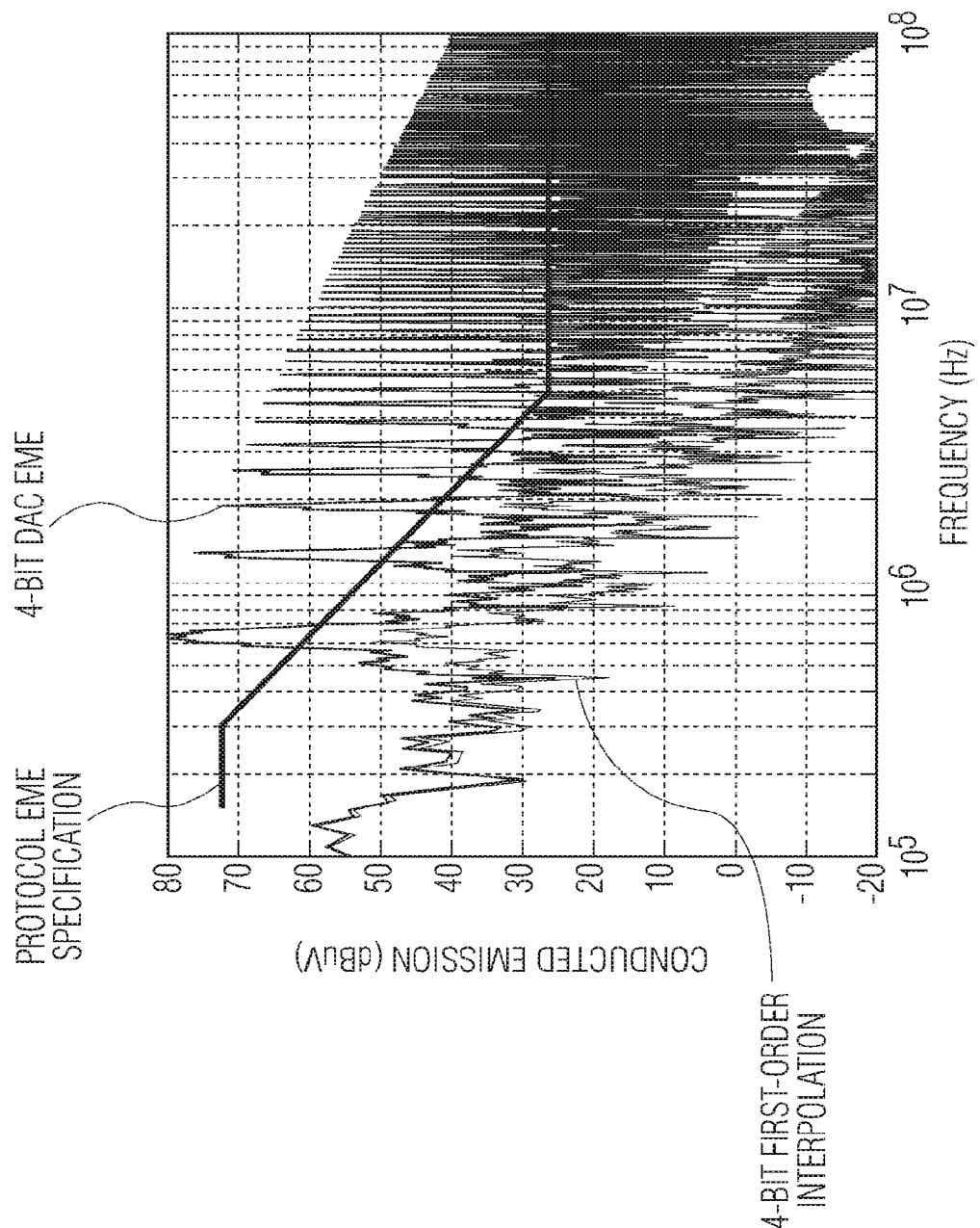

FIG. 12 is a graph of an EM emission of the DAC depicted in FIG. 7 versus an EM emission of a conventional 4-bit DAC.

Figure 13:
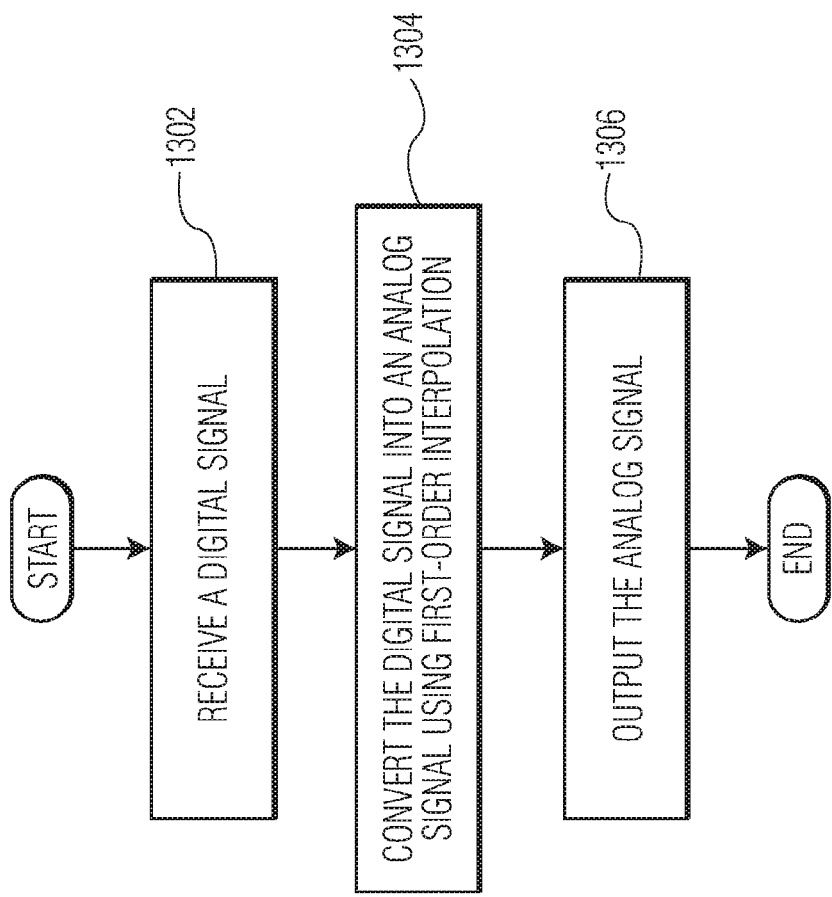

FIG. 13 is a process flow diagram of a method for operating a DAC in accordance with an embodiment of the invention.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

FIG. 1 is a schematic block diagram of a communications system 100 in accordance with an embodiment of the invention. In the embodiment depicted in FIG. 1, the communications system includes a communication device 102, which includes a transceiver circuit 104, and a communications network 106. The communications system can be used to facilitate communications between communication devices/nodes. In some embodiments, the communications system is used in a vehicle. Examples of a vehicle may include, without limitation, an automobile, a bus, a train, an industrial or agricultural vehicle, a ship, or an aircraft. Although the communications system is shown in FIG. 1 as including certain components, in some embodiments, the communications system includes less or more components to implement less or more functionalities.

The transceiver circuit 104 of the communication device 102 is configured to communicate with other communication devices/nodes. In the embodiment depicted in FIG. 1, the transceiver circuit is configured to communicate with the communications network 106 through a communications bus 108. The communications bus can be any suitable type of communications bus. In some embodiments, the communications bus is a single-ended communications bus. In a single-ended communications bus, signals are carried by the voltage of a single wire. Compared to a differential communications bus, in which the same information is transmitted with opposite voltages simultaneously through two sets of wires, the single-ended communications bus can be less expensive and easier to implement. For example, compared to differential communications buses, single-ended communications buses use fewer wires, allowing the reduction of harness (e.g., electrical wirings) in a vehicle. In some embodiments, the single-ended communications bus is a bus that is compatible with the Local Interconnect Network (LIN) protocol, which is a serial communication protocol suitable for a low cost and high performance in-vehicle network (IVN). In some embodiments, the communications bus is one wire of a differential bus. The transceiver circuit is also configured to communicate with a microcontroller 110. The microcontroller may be connected to a sensor/actuator device to control the sensor/actuator device and/or to gather information from the sensor/actuator device. The sensor/actuator device can be a sensor that is used to collect operating parameters in a vehicle and/or an actuator, such as a controller that is used to control a certain function/component of a vehicle, e.g., airbags, antilock brakes, etc. In some embodiments, instead of the microcontroller, the communications system includes other devices that communicate with the transceiver circuit and perform different functions.

In the embodiment depicted in FIG. 1, the transceiver circuit 104 includes a receiver section 112 and a transmitter section 114. The receiver section is configured to receive information from the communications bus 108 and to transmit the received information to the microcontroller 110 or other device. The transmitter section is configured to receive information from the microcontroller or other device and to transmit the received information to the communications network 106 through the communications bus. The transmitter section includes a DAC 116, which is configured to convert a digital input signal into an analog signal. The DAC includes an input terminal 118, a converter circuit 120, and an output terminal 122. The input terminal is configured to receive a digital signal. The converter circuit is configured to convert the digital signal into an analog signal, which may be carried as a current or a voltage, using first-order interpolation. First-order interpolation is also referred to as linear interpolation in which the transition of the analog signal generated by the converter circuit is in accordance with a linear function. The output terminal is configured to output the analog signal. The DAC operates as a waveform generator to shape an analog waveform, which is transmitted to the communications bus 108. Compared to an analog wave-shaping device, the DAC can operate faster, is more compact in dimension, and is easier to configure. Instead of performing digital-to-analog conversation in discrete steps, the transition in the analog domain of the DAC is done by linear segments. Consequently, the EME of the transceiver circuit can be reduced. In an embodiment, the DAC is formed by unit cells based on a differential stage. In another embodiment, the DAC charges or discharges a capacitor using multiple current sources.

The transceiver circuit 104 can be implemented as an automotive transceiver that is used in a vehicle to enable communication between Electronic Control Units (ECU). For example, the transceiver circuit may be an automotive transceiver that is compatible with Controller Area Network (CAN) protocol, Local Interconnect Network (LIN) protocol, or FlexRay protocol. In the embodiment depicted in FIG. 1, the DAC 116 is configured to generate an analog signal that is transmitted on the communications bus 108. Because the DAC performs digital-to-analog conversion using first-order interpolation, the transceiver circuit can have good electromagnetic compatibility (EMC) and can achieve high EM immunity and low EM emission, even in an extremely harsh environment. Consequently, the transceiver circuit can be used in critical applications, such as Anti-lock braking system (ABS) or power train control.

The communications network 106 of the communications system 100 is configured to receive data from the communication device 102 and to transmit data to the communication device. In the embodiment depicted in FIG. 1, the communications network is configured to communicate with the transceiver circuit 104 through the communications bus 108.

In some embodiments, the communications system 100 is part of a Local Interconnect Network (LIN). In these embodiments, the communications bus 108 is a LIN bus and the transceiver circuit 104 is compatible with the LIN protocol, e.g., the LIN Specification 2.2.A. Compared to differential IVN protocols, e.g. CAN or FlexRay, a LIN bus is a single-ended bus, thereby allowing for the reduction of electrical wiring in a vehicle.

Figure 2:
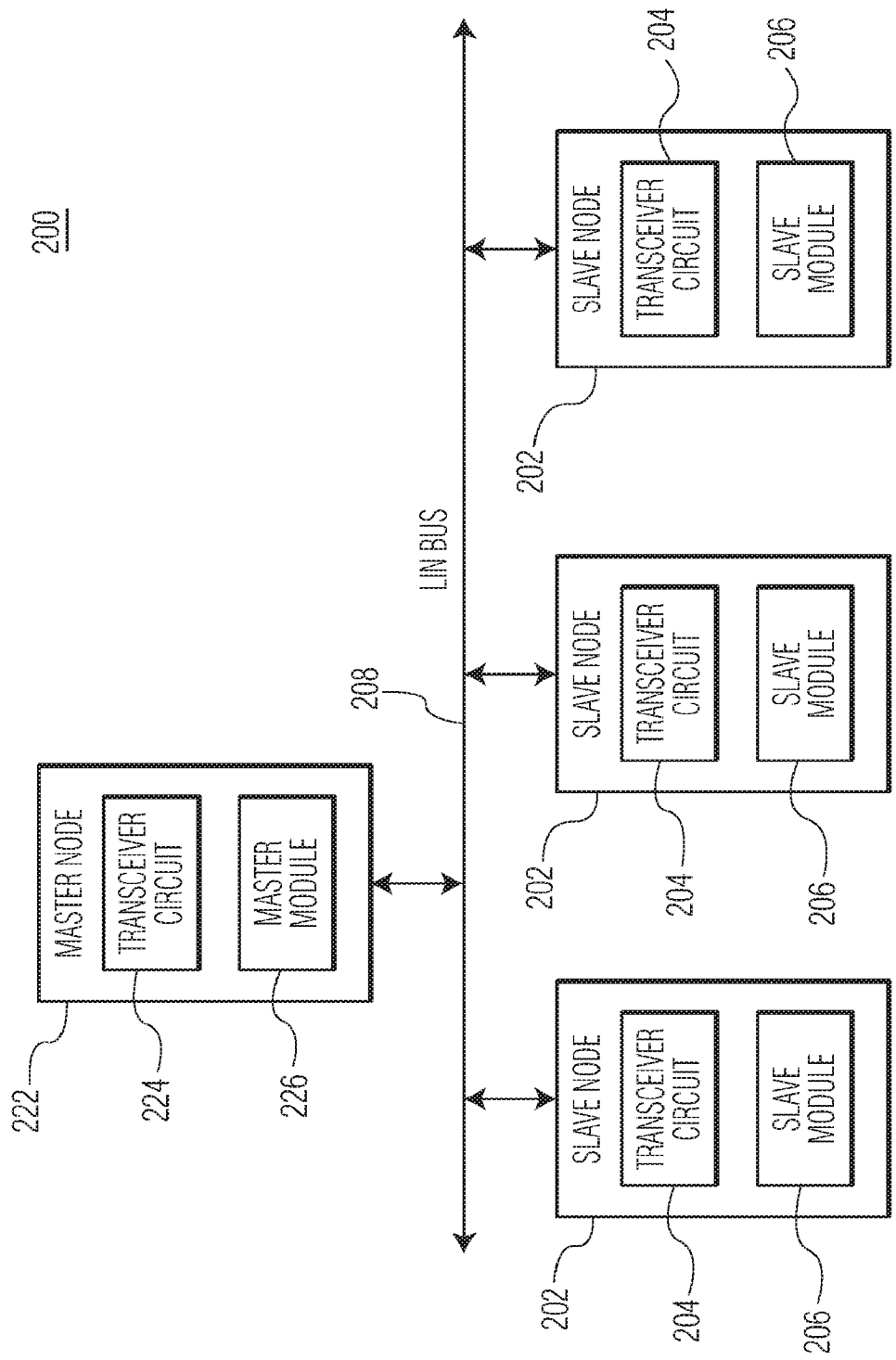
FIG. 2 depicts a communications system that is compatible with the Local Interconnect Network (LIN) protocol.

FIG. 2 depicts a communications system that is compatible with the LIN protocol. In the embodiment depicted in FIG. 2, a LIN communications system 200 includes one or more slave nodes 202 and a master node 222, which acts as a control unit for the slave nodes. The slave nodes and the master node are connected to a LIN bus 208 and communicate via the LIN protocol. Each of the slave nodes includes a transceiver circuit 204 and a slave module 206 that can communicate with a corresponding microcontroller or other device using the corresponding transceiver circuit. Each transceiver circuit 204 may be similar to or the same as the transceiver circuit 104. The master node includes a transceiver circuit 224 and a master module 226 that can initiate communications between the master device and a corresponding slave device through the LIN bus. The transceiver circuit 224 may be similar to or the same as the transceiver circuit 104.

Figure 3:
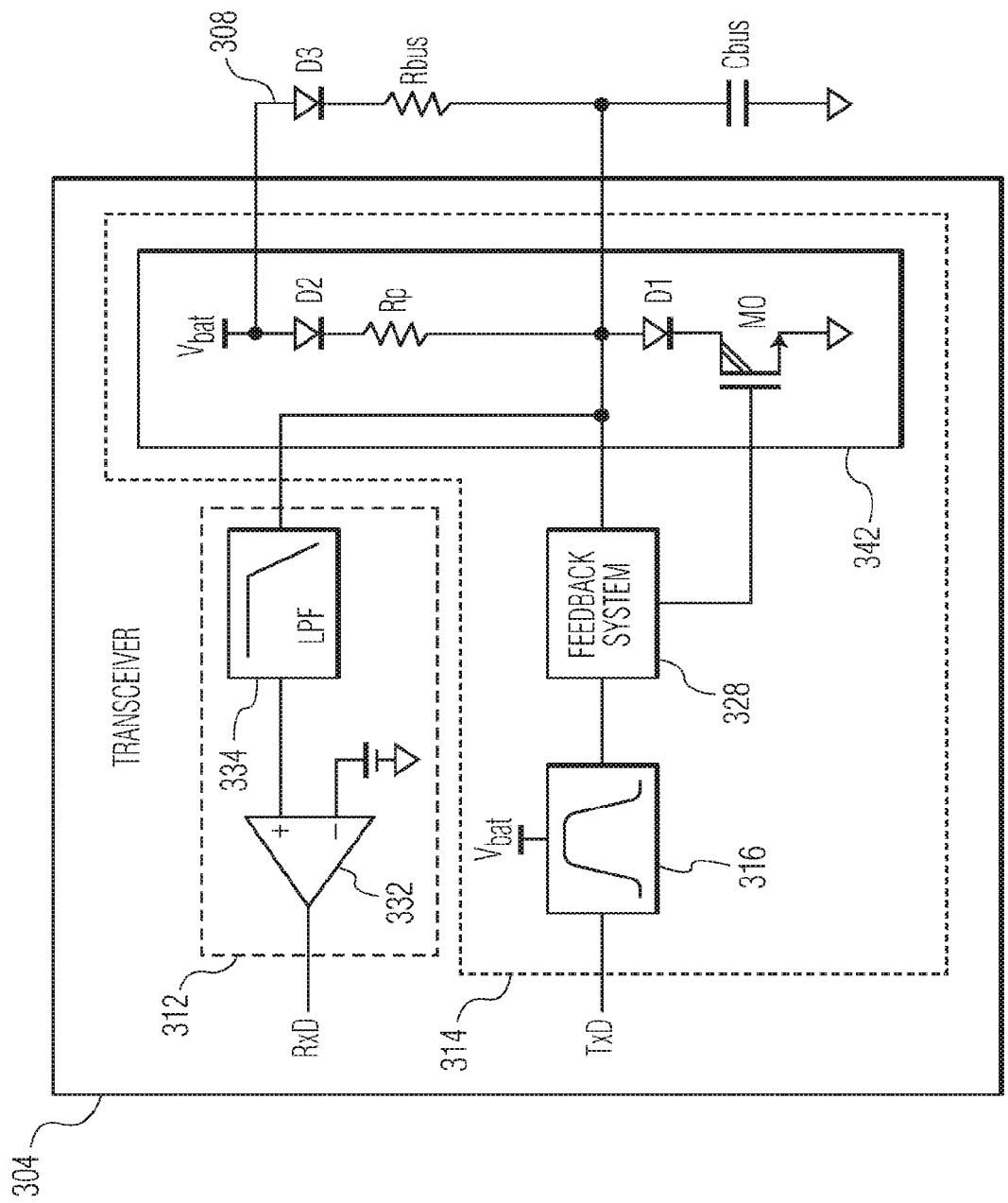
FIG. 3 depicts an embodiment of the transceiver circuit depicted in FIG. 1.

FIG. 3 depicts an embodiment of the transceiver circuit 104 of FIG. 1. In the embodiment depicted in FIG. 3, a transceiver circuit 304 includes a receiver section 312 and a transmitter section 314. In some embodiments, the transceiver circuit is compatible with the LIN protocol. The transceiver circuit depicted in FIG. 3 is one possible embodiment of the transceiver circuit depicted in FIG. 1, however, the transceiver circuit depicted in FIG. 1 is not limited to the embodiment shown in FIG. 3.

The receiver section 312 and the transmitter section 314 of the transceiver circuit 304 are connected to a communications bus. In some embodiments, the communications bus is a LIN bus. The impedance of the communications is characterized by a resistor, "Rbus," which corresponds to an external termination, such as 1 kΩ master termination and a lumped internal slave termination, connected in series with a diode, "D3," and a capacitor, "Cbus," which corresponds to parasitic capacitance and other capacitance (e.g., external decoupling capacitance).

The receiver section 312 includes a low-pass filter 334 and a voltage comparator 332, which may include an error amplifier. The voltage comparator generates a data signal, "RxD," which is transmitted to the microcontroller 110 (shown in FIG. 1) or other device. The low-pass filter is connected to the transmitter section and to the communications bus 308. The low-pass filter is used to protect the voltage comparator 332, at which the received signal, RxD, is generated. In some embodiments, the receiver section is implemented as a standard LIN receiver.

The transmitter section 314 includes an output stage or a driving stage 342, a waveshaping DAC 316, and a feedback system 328. The transmitter section receives a data signal, "TxD," from the microcontroller 110 (shown in FIG. 1) or other device. The output stage includes a transistor, "M0," which can be used as a voltage-controlled current source or resistor, diodes, "D1," "D2," and a pull-up resistor, $R_p$. In some embodiments, the pull-up resistor, $R_p$, has a resistance value of 30 kΩ. The waveshaping DAC is configured to convert a digital signal into an analog signal in response to a supply voltage, "Vbat," which may be a battery voltage. The waveshaping DAC can shape transition edges between the supply voltage, Vbat, and ground while maintaining proper timing as given by the signal, TxD. The feedback system can compensate for the variations in the waveform of the analog signal received from the waveshaping DAC, which variations can be encountered on the communications bus 308.

Figure 4:
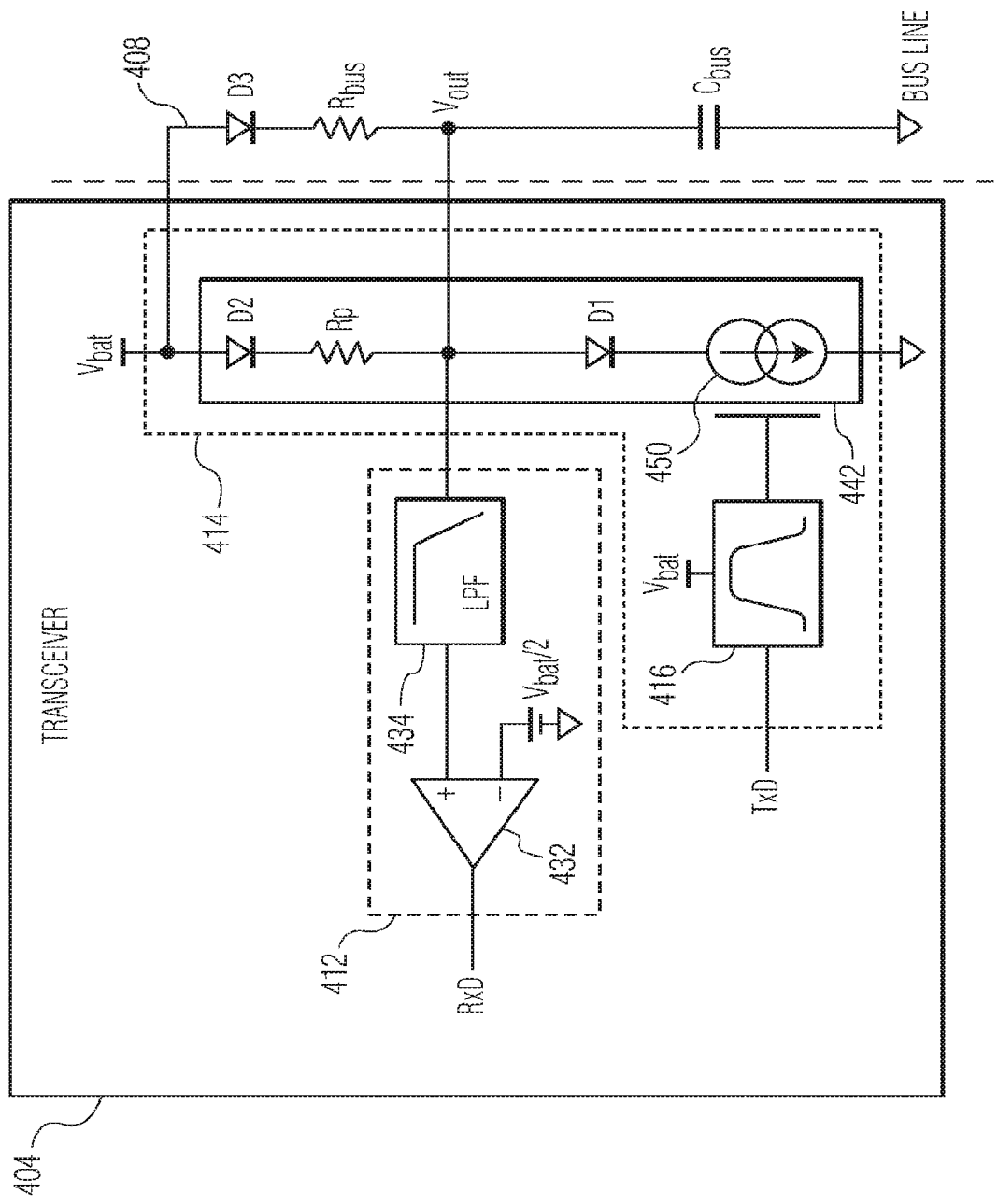
FIG. 4 depicts another embodiment of the transceiver circuit depicted in FIG. 1.

FIG. 4 depicts another embodiment of the transceiver circuit 104 of FIG. 1. In the embodiment depicted in FIG. 4, a transceiver circuit 404 includes a receiver section 412 and a transmitter section 414. In some embodiments, the transceiver circuit is compatible with the LIN protocol. The transceiver circuit depicted in FIG. 4 is one possible embodiment of the transceiver circuit depicted in FIG. 1, however, the transceiver circuit depicted in FIG. 1 is not limited to the embodiment shown in FIG. 4.

The receiver section 412 and the transmitter section 414 of the transceiver circuit 404 are connected to a communications bus 408. In some embodiments, the communications bus is a LIN bus. The impedance of the communications is characterized by a capacitor, "Cbus," which corresponds to parasitic capacitance and other capacitance (e.g., external decoupling capacitance), connected in series with a diode, "D3," and a capacitor, "Cbus," which corresponds to parasitic capacitance and other capacitance (e.g., external decoupling capacitance).

The receiver section 412 of the transceiver circuit 404 includes a voltage comparator 432, which may include an error amplifier, and a low-pass filter 434. The voltage comparator generates a data signal, "RxD," which is transmitted to the microcontroller 110 (shown in FIG. 1) or other device. The receiver section 412 depicted in FIG. 4 may be similar to or the same as the receiver section 312 depicted in FIG. 3.

The transmitter section 414 of the transceiver circuit 404 includes an output stage or a driving stage 442 and a waveshaping DAC circuit 416. The transmitter section receives a data signal, "TxD," from the microcontroller 110 (shown in FIG. 1) or other device. The output stage 442 includes a voltage-controlled current source 450, diodes, "D1," "D2," and a pull-up resistor, $R_p$. In some embodiments, the pull-up resistor, $R_p$, has a resistance value of 30 kΩ. The waveshaping DAC is configured to convert a digital signal into an analog signal in response to a supply voltage, "Vbat," which may be a battery voltage. The waveshaping DAC can shape transition edges between the supply voltage, Vbat, and ground while maintaining proper timing as given by the signal, TxD.

Figure 5:
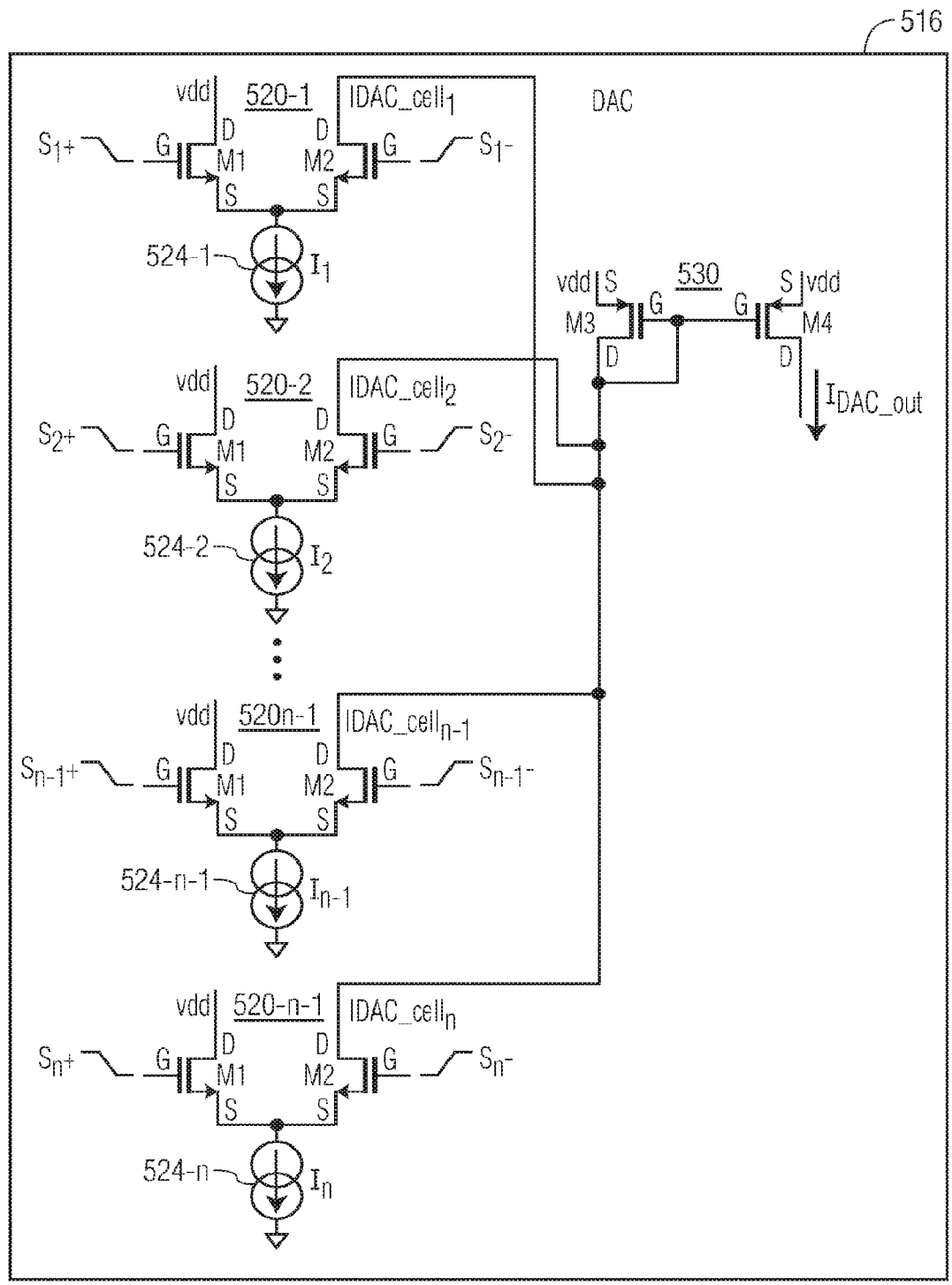
FIG. 5 depicts an embodiment of the DAC of FIG. 1 that is formed by unit cells.

FIG. 5 depicts an embodiment of the DAC 116 of FIG. 1 that is formed by unit cells. In the embodiment depicted in FIG. 5, a DAC 516 is an n-bit DAC, which includes n unit cells 520-1, . . . , 520-n (n is a positive integer), and a current mirror 530. The DAC depicted in FIG. 5 is one possible embodiment of the DAC depicted in FIG. 1, however, the DAC depicted in FIG. 1 is not limited to the embodiment shown in FIG. 5.

In the embodiment depicted in FIG. 5, each DAC cell 520 of the DAC 516 includes a pair of NMOS transistors, "M1," and "M2," and a current source 524-1, . . . , or 524-n with a current $I_1$, . . . , or $I_n$. However, in some other embodiments, each DAC cell includes a pair of PMOS transistors. Each DAC cell is driven by a corresponding differential signal, $S_1$, . . . , or $S_n$, which is applied to the gate terminals, "G," of the transistors, M1 and M2. Each differential signal, $S_1$, . . . , or $S_n$ includes a positive component, $S_{1+}$, . . . , or $S_{n+}$, and a negative component, $S_{1-}$, . . . , or $S_{n-}$, which negative component is equal to the corresponding positive component and has the opposite polarity to the corresponding positive component. In some embodiments, the differential signals, $S_1$, . . . , $S_n$, are different from each other. In operation, a voltage, "Vdd," is applied to the drain terminal, "D," of a transistor, M1, of a corresponding DAC cell. In each DAC cell, the current source 524-1, . . . , or 524-n is connected to the source terminals, "S," of the transistors, M1, and M2, and to a fixed voltage, such as ground. A voltage, "Vdd," is applied to the drain terminal, "D," of a transistor, M1, of a corresponding DAC cell. The output current, "IDAC_cell$_{1,2, \ldots, n-1,}$ or $_n$," of a DAC cell is the current that flows through the drain terminal, "D," of the corresponding transistor, M2. The linear transition of the output current, IDAC_cell, is achieved by driving the transistors, M1 and M2, using a linear voltage ramp of the corresponding differential signal, $S_1$, . . . , or $S_n$. The slope of the output current, IDAC_cell$_{1,2, \ldots, n-1}$, or $_n$, of each DAC cell is set by the amplitude and the slew-rate of the differential input voltage ramp. In the embodiment depicted in FIG. 5, non-uniform bit weight is implemented in the DAC 516 by appropriate current levels ($I_1, I_2, \ldots, I_{n-1}, I_n$) of the unit cells of the DAC.

Figure 6:
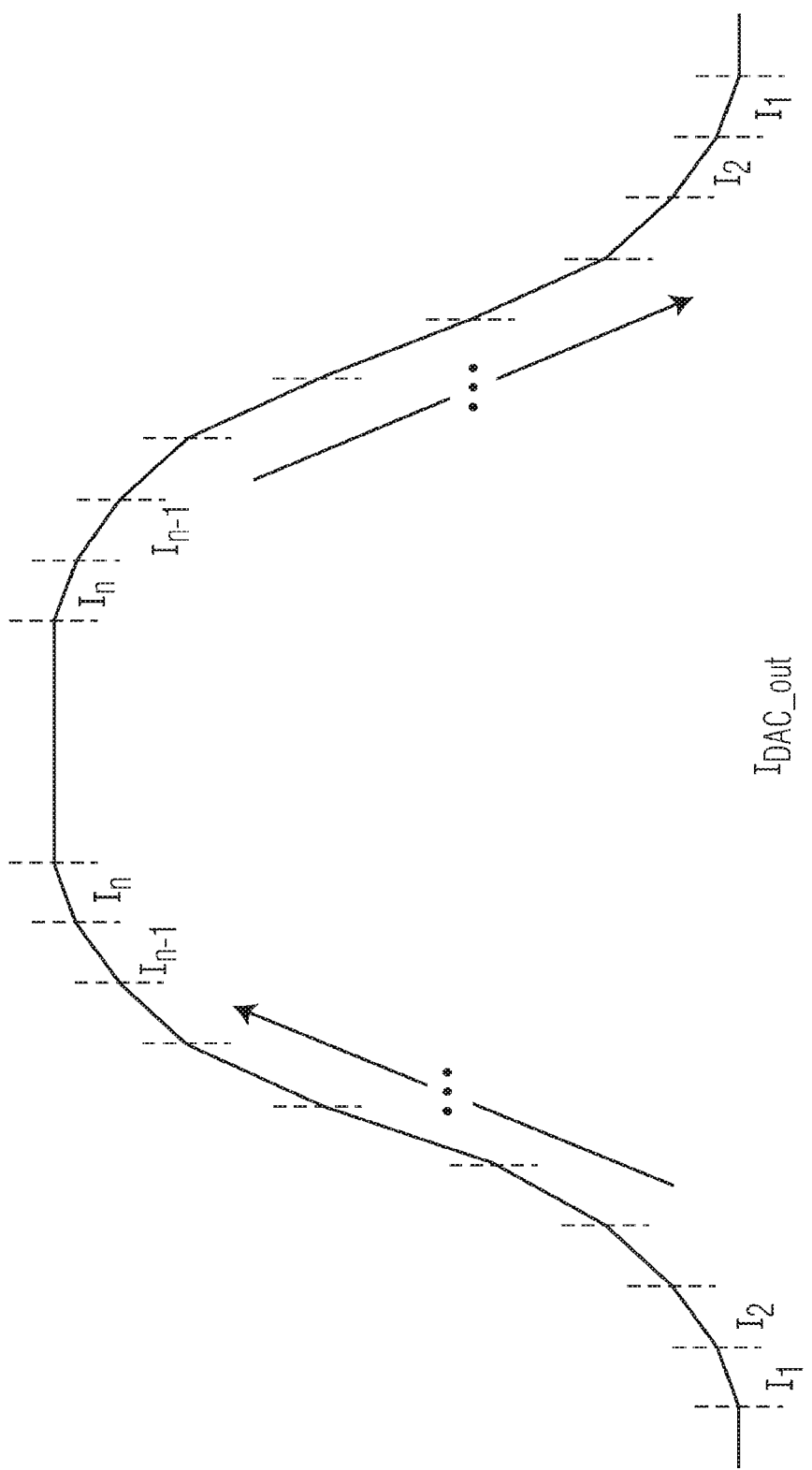
FIG. 6 is a graph of an output current of the DAC depicted in FIG. 5.

In the embodiment depicted in FIG. 5, each of the unit cells 520-1, . . . , 520-n of the DAC 516 is connected to the current mirror 530. The current mirror circuit includes a pair of PMOS transistors, "M3," and "M4." However, in some other embodiments, the current mirror circuit includes a pair of NMOS transistors. The gate terminals, "G," of the transistors, M3, and M4, are connected to each other. In operation, voltage, "Vdd," is applied to the source terminals, "S," of the transistors, M3, and M4 and the drain terminal, "D," of the transistor, M3, is configured to receive the current from each of the DAC cells of the DAC. Each unit cell generates an output current, IDAC_cell, which constitutes a linear segment. The drain terminal, "D," of the transistor, M4, is configured to output an output current, "IDAC_out." The output signal of the DAC is the output current, "IDAC_out," that flows out of the current mirror and corresponds to the sum of the output currents, IDAC_cell, from the unit cells. In an embodiment, the DAC is clocked at a fixed frequency and the bit weights are defined in order to shape the transitions. FIG. 6 is a graph of the output current, IDAC_out, of the DAC depicted in FIG. 5 during an operation of the DAC. In particular, FIG. 6 illustrates the first-order interpolation DAC output current IDAC_out. Each segment corresponds to the output current of each DAC cell from $I_1$ to $I_n$. The sum of the current $I_1, \ldots,$ or $I_n$ of each DAC cell yields the output current IDAC_out.

FIG. 7 depicts an embodiment of the DAC 116 of FIG. 1 that is formed by a capacitor charged or discharged by constant current sources. In the embodiment depicted in FIG. 7, a DAC 716 includes an output capacitor 720, a 3-position switch 722, two shift registers 724-1, 724-2, and two banks/sets 726-1, 726-2, of current sources 728-1, ..., 728-n and 738-1, ..., 738-n that output corresponding currents $I_1, \ldots, I_n$, where n is a positive integer, and selection switches 730-1, ..., 730-n and 740-1, ..., 740-n. In operation, voltage, "Vdd," is applied to the current sources 728-1, ..., 728-n while the current sources 738-1, ..., 738-n are connected to a fixed voltage, such as the ground. The DAC depicted in FIG. 7 is one possible embodiment of the DAC depicted in FIG. 1, however, the DAC depicted in FIG. 1 is not limited to the embodiment shown in FIG. 7.

In the embodiment depicted in FIG. 7, the output capacitor 722 is configured to be charged or discharged by the current sources 728, 738 in response to a toggling of the 3-position switch 722. The shift registers 724 are configured to generate voltage signals, "V1," "V2," ... "Vn−1," "Vn," for driving the selection switches 730, 740 in response to a toggling of the 3-position switch. FIG. 8 is a graph of the voltage signals, V1, V2, ... Vn−1, Vn that are generated by the shift registers depicted in FIG. 7. As illustrated in FIG. 8, the voltage signals, V1, V2, ... Vn−1, Vn are pulses with logic high that are sequential in time.

Turning back to FIG. 7, the output signal of the DAC 716 is the voltage, "Vout," across the output capacitor 720. The bit weights of the DAC are set by the amplitude of the current sources 728-1, ..., 728-n and 738-1, ..., 738-n. In an embodiment, the DAC is clocked at a fixed frequency and the bit weights are defined in order to shape the transitions. The rising and falling edges are shaped by charging or discharging the output capacitor, respectively.

An example of the operation of the DAC 716 is described as follows. When the 3-position switch 722 is set to position 1, a rising edge is generated and a pulse is sent through the n-bit shift register 724-1 that generates voltage signals, V1, V2, ... Vn−1, Vn (n being an integer larger than 1) to drive the selection switches 730-1, ..., 730-n that are connected to the top current sources 728-1, ..., 728-n. When the 3-position switch is set to position 2, the output capacitor 720 remains in its state of charge and the output voltage, Vout, is constant. When the 3-position switch is set to position 3, a falling edge is generated and a pulse is sent through the n-bit shift register 724-2 that generates voltage signals, V1, V2, Vn−1, Vn to drive the selection switches 740-1, ..., 740-n that are connected to the bottom current sources 738-1, ..., 738-n.

FIG. 9 is a graph of a rising edge of the output voltage, Vout, of the DAC 716 depicted in FIG. 7 versus a rising edge of the output voltage of a conventional 3-bit DAC. FIG. 10 is a graph of a rising edge of the output voltage, Vout, of the DAC depicted in FIG. 7 versus a rising edge of the output voltage of a conventional 4-bit DAC. FIG. 11 is a graph of a complete waveform of the output voltage, Vout, of the DAC depicted in FIG. 7 versus complete waveform of the output voltage of a conventional 4-bit DAC. As shown in FIGS. 9-11, the conventional 3-bit DAC has 8 steps to shape the rising edge while the conventional 4-bit DAC has 16 steps to shape the rising edge and 32 steps to shape the complete waveform. Compared to the conventional 3-bit DAC and the conventional 4-bit DAC, the DAC 716 has a smoother output waveform.

In a conventional DAC, the transition from one bit to another is made by way of hard switching, which results in high EME. The DAC 716 uses first-order interpolation to shape a waveform. Compared to a conventional DAC, the output voltage is increased in linear segments, instead of steps. Consequently, the waveform of the output voltage, "Vout," is smoother and the EME is reduced. FIG. 12 is a graph of an EM emission of the DAC depicted in FIG. 7 versus an EM emission of a conventional 4-bit DAC. In the example of FIG. 12, the EM emission of the conventional DAC largely violates the LIN protocol specifications. First-order interpolation allows an attenuation of 30 dB of the first harmonic component and the amplitudes of the subsequent harmonics decrease by 40 dB/decade instead of 20 dB/decade for the conventional DAC. Consequently, the first-order interpolated DAC 716 can comply with EM specifications without using a low-pass filter while achieving a low disturbance level.

FIG. 13 is a process flow diagram of a method for operating a DAC in accordance with an embodiment of the invention. The DAC may be similar to or the same as the DAC 116 depicted in FIG. 1, the DAC 316 depicted in FIG. 3, the DAC 416 depicted in FIG. 4, the DAC 516 depicted in FIG. 5, and/or the DAC 716 depicted in FIG. 7. At block 1302, a digital signal is received. At block 1304, the digital signal is converted into an analog signal using first-order interpolation. At block 1306, the analog signal is outputted.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A digital-to-analog converter (DAC), the DAC comprising:
   an input terminal configured to receive a digital signal;
   a converter circuit configured to convert the digital signal into an analog signal using first-order interpolation to shape the analog signal by shaping transition edges of the digital signal, wherein the converter circuit comprises a plurality of DAC cells, each of the DAC cells includes a pair of transistors and a current source connected to the pair of transistors and a fixed voltage; and
   an output terminal configured to output the analog signal.

2. The DAC of claim 1, wherein the converter circuit further comprises:
   a current mirror circuit connected to each of the DAC cells.

3. The DAC of claim 1, wherein the pair of transistors comprises:
   gate terminals configured to receive a differential signal; and
   source terminals or drain terminals configured to receive a current or to output a current.

4. The DAC of claim 3, wherein the converter circuit further comprises:
   a current mirror circuit connected to each of the DAC cells, wherein the current mirror circuit comprises a second pair of transistors, and wherein the second pair of transistors comprises:
   gate terminals connected to each other; and
   source terminals or drain terminals configured to receive the current from each of the DAC cells or to output the analog signal, wherein the analog signal comprises an output current.

5. The DAC of claim 1, wherein the pair of transistors of each of the DAC cells is configured to receive a unique differential signal.

6. The DAC of claim 1, wherein the converter circuit comprises:
   a plurality of sets of current sources and selection switches;
   a switch connected to the sets of current sources and selection switches; and
   an output capacitor connected to the switch.

7. The DAC of claim 6, wherein the output capacitor is configured to be charged or discharged by the current sources in response to a toggling of the switch.

8. The DAC of claim 6, wherein the converter circuit further comprises:
   a plurality of shift registers configured to generate driving signals for the selection switches in response to a toggling of the switch.

9. The DAC of claim 6, wherein the switch is a 3-position switch.

10. A transceiver circuit comprising the DAC of claim 1.

11. A method for operating a digital-to-analog converter (DAC), the method comprising:
    receiving a digital signal;
    converting the digital signal into an analog signal using first-order interpolation to shape the analog signal by shaping transition edges of the digital signal, wherein the converting is performed by a converter circuit that includes a plurality of DAC cells, each of the DAC cells includes a pair of transistors and a current source connected to the pair of transistors and a fixed voltage; and
    outputting the analog signal.

12. The method of claim 11, wherein converting the digital signal into the analog signal using first-order interpolation comprises:
    driving the plurality of DAC cells with differential signals.

13. The method of claim 11, wherein converting the digital signal into the analog signal using first-order interpolation comprises:
    charging or discharging a capacitor using multiple current sources.

14. A transceiver circuit, the transceiver circuit comprising a receiver section and a transmitter section for connection to a single-ended communications bus, the transmitter section comprises:
    a digital-to-analog converter (DAC), the DAC comprising:
    an input terminal configured to receive a digital signal;
    a converter circuit configured to convert the digital signal into an analog signal using first-order interpolation to shape the analog signal by shaping transition edges of the digital signal, wherein the converter circuit includes plurality of DAC cells, each of the DAC cells includes a pair of transistors and a current source connected to the pair of transistors and a fixed voltage; and
    an output terminal configured to output the analog signal.

15. The transceiver circuit of claim 14, wherein the converter circuit comprises
    a current mirror circuit connected to each of the DAC cells.

16. The transceiver circuit of claim 14, wherein the converter circuit comprises:
    a plurality of sets of current sources and selection switches;
    a 3-position switch connected to the sets of current sources and selection switches;
    an output capacitor connected to the 3-position switch and configured to be charged or discharged by the current sources in response to a toggling of the 3-position switch; and
    a plurality of shift registers configured to generate driving signals for the selection switches in response to the toggling of the 3-position switch.

* * * * *